(12) United States Patent
He et al.

(10) Patent No.: US 6,657,272 B2
(45) Date of Patent: Dec. 2, 2003

(54) OFF-AXIS SILICON SUBSTRATE FOR OPTIMIZED OPTICAL COUPLING

(75) Inventors: Jing-Hua He, Hillsboro, OR (US); Muhammad Arif, Allentown, PA (US); Rao Yelamarty, Allentown, PA (US); Hak Byun, Upper Darby, PA (US); Christina Arnold, Perkasie, PA (US)

(73) Assignee: Triquint Technology Holding Co., Hillsboro, OR (US)

( * ) Notice: Subject to any disclaimer, the term of this patent is extended or adjusted under 35 U.S.C. 154(b) by 13 days.

(21) Appl. No.: 10/125,999

(22) Filed: Apr. 19, 2002

(65) Prior Publication Data

US 2003/0197236 A1 Oct. 23, 2003

(51) Int. Cl.[7] .......................... H01L 31/00; H01L 29/06
(52) U.S. Cl. ...................... 257/466; 257/622; 257/627; 257/628
(58) Field of Search .................. 257/466, 622, 257/627, 628, 521, 522; 438/445, FOR 123

(56) References Cited

U.S. PATENT DOCUMENTS

| | | | | |
|---|---|---|---|---|
| 4,127,932 A | * | 12/1978 | Hartman et al. | 29/590 |
| 4,294,510 A | * | 10/1981 | Chappell | 350/96.17 |
| 4,750,799 A | * | 6/1988 | Kawachi et al. | 350/96.11 |
| 4,904,036 A | * | 2/1990 | Blonder | 350/96.11 |
| 5,518,965 A | * | 5/1996 | Menigaux et al. | 156/647 |
| 5,987,196 A | * | 11/1999 | Noble | 385/14 |
| 5,987,202 A | * | 11/1999 | Gruenwald et al. | 385/49 |
| 6,316,281 B1 | * | 11/2001 | Lee et al. | 438/31 |
| 6,456,761 B2 | * | 9/2002 | Yap et al. | 385/33 |
| 6,483,969 B1 | * | 11/2002 | Yap et al. | 385/50 |
| 2003/0007754 A1 | * | 1/2003 | Terashima | 385/92 |

* cited by examiner

Primary Examiner—Jasmine Clark
(74) Attorney, Agent, or Firm—Christie, Parker & Hale, LLP

(57) ABSTRACT

An optical receiver having a silicon substrate with a top surface cleaved from a [100] silicon crystallographic plane and a reflector, and a photodetector coupled to the top surface of the silicon substrate, the photodetector being adapted to receive an incoming signal from a fiber.

18 Claims, 8 Drawing Sheets

OFF-AXIS SILICON SUBSTRATE FOR OPTIMIZED OPTICAL COUPLING

FIELD OF THE INVENTION

The present invention relates generally to electro-optic devices and more particularly, to an optical sub-assembly for interfacing electro-optical devices with optical fibers.

BACKGROUND OF THE INVENTION

The proliferation of optical communication networks intended for subscribers has created a strong demand for low-cost and compact optical assemblies. One factor that increases cost is the necessity of precision alignment between the end of an optical fiber and an optoelectronic device. The precision of alignment that is required between the end of an optical fiber and an optoelectronic device via a reflector varies with application.

For example, on the receiving side of an optical communication system, a received optical signal is optoelectrically converted into an electrical signal by a photodetector such as a photodiode, and information is reproduced according to the electrical signal obtained. Alignment difficulties on the receiver side of an optical communication system may be introduced by characteristics of the optical fiber, the photodetector, and a reflector reflecting the optical signal from the optical fiber to the photodetector.

The alignment difficulty may generally be addressed by making a detector "artificially" larger than it needs to be, resulting in slower photodetectors with inherently larger rise times, fall times, and settling times. Larger photodetectors may therefore limit system level bandwidth which ultimately limits transmission data rates. The bandwidth of a photodetector is generally determined by the transit time of the photo-generated carriers in the absorption region and the RC time constant. The inherently lower bandwidth, for larger photodetectors, is caused by higher shunt resistance and larger shunt capacitance of the photo conductive areas of the detectors. More rapid response requires a smaller electrostatic capacitance at the depletion layer. The electrostatic capacitance decreases with decreasing depletion region area. Therefore, the diameter of the light receiving portion of high speed photodetectors are typically restricted to minimize the capacitance of the device.

However, optical beams emanating from an optical fibers are typically divergent and have a relatively wide cross-sectional area that requires a wide depletion region. For smaller detectors, the reflected beam may miss the active area of the detector altogether, giving rise to low coupling or no coupling. Moreover, the size of the reflected beam makes it necessary to perform a relatively difficult active alignment in the x, y and z planes. It would therefore be advantageous to provide a compact, high speed optical subassembly to efficiently couple light into a photodetector. It would also be advantageous to provide an optical sub-assembly that simplifies alignment between the fiber and the photodetector.

Further, light beams emanating from a fiber often travel through v-grooves of an optical sub-assembly. Currently used v-grooves, which are also produced by etching from the [100] crystallographic plane, may clip some light, resulting in low coupling. Therefore, it would be advantageous to provide an optical sub-assembly with v-grooves that do not clip light from the optical fiber.

SUMMARY OF THE INVENTION

In an exemplary embodiment of the present invention, an optical receiver includes a photodetector adapted to receive an incoming optical signal from a fiber. The photodetector is coupled to a silicon substrate with a top surface cleaved from a [100] silicon crystallographic plane by about 5.7° to 9.7° and a reflector extending from the top surface.

The reflector is created by etching into the silicon substrate from the top surface along a [111] silicon crystallographic plane. The reflector has an angle of about 45° to about 49° relative to the top surface. A light beam emanating from the fiber is reflected off of the reflector onto the photodetector.

The present invention is also directed to a method for manufacturing an optical receiver. In an exemplary embodiment, the method involves cleaving a silicon substrate having a top surface along a [100] silicon crystallographic plane by about 5.7° to about 9.7° to form an off-axis top surface of an optical sub-assembly. The off-axis top surface is etched along a [111] silicon crystallographic plane to form a reflector having an angle of about 45° to about 49° relative to the off-axis top surface.

It is understood that other embodiments of the present invention will become readily apparent to those skilled in the art from the following detailed description. The described embodiments of the invention illustrate the best modes contemplated for carrying out the invention. As it will be realized, the invention is capable of other and different embodiments and the details are capable of modification in various other respects, all without departing from the spirit and scope of the present invention. Accordingly, the drawings and detailed description are to be illustrative in nature and not restrictive.

BRIEF DESCRIPTION OF THE DRAWINGS

These and other features, aspects, and advantages of the present invention will become better understood with regard to the following description, appended claims, and accompanying drawings, in which:

DETAILED DESCRIPTION OF THE INVENTION

An exemplary embodiment of the present invention provides an apparatus and method for interfacing a high speed photodetector with an optical fiber. In order to appreciate the advantages of the present invention, it will be beneficial to describe the invention in the context of an exemplary optical receiver module.

Figure 1:
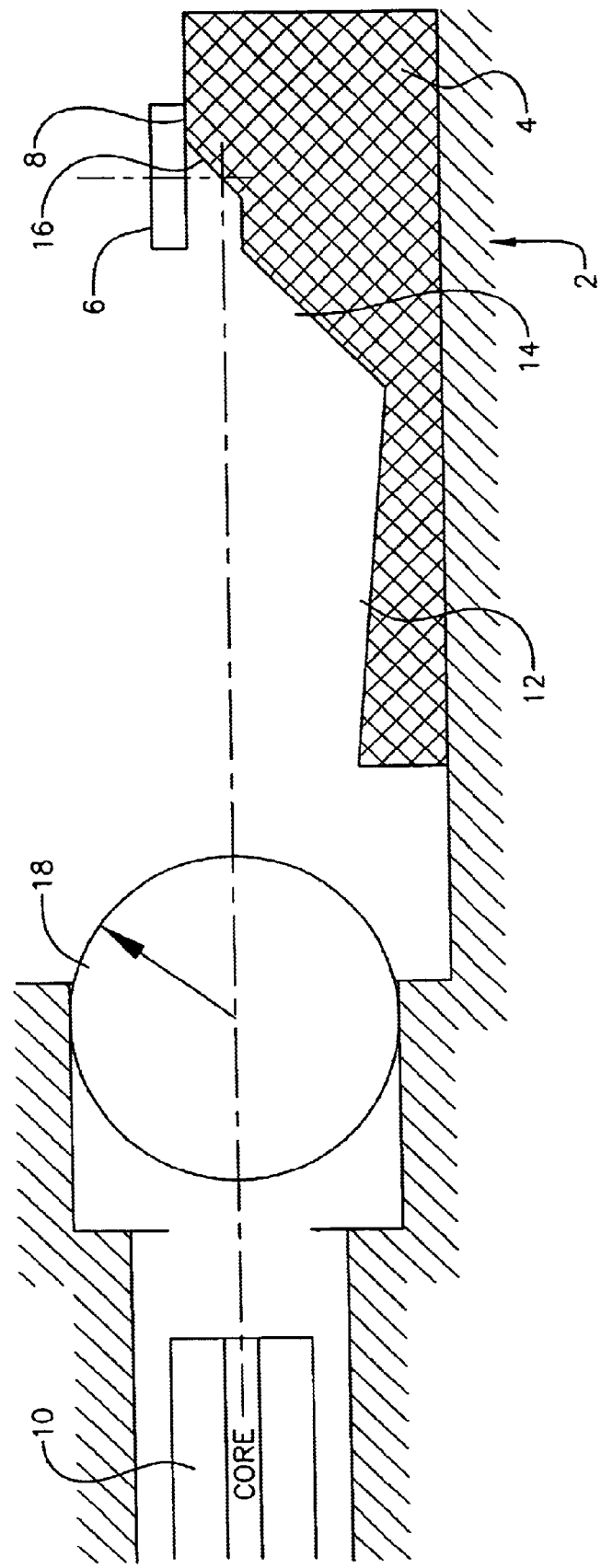
FIG. 1 is a cross section of a fiber to photodetector interface in accordance with an exemplary embodiment of the present invention.

Referring to FIG. 1, an optical receiver module according to an embodiment of the present invention has a housing 2. Contained within the housing is an optical sub-assembly 4 formed of a silicon substrate. A photodetector 6 is coupled to a metal contact pad 8 located on the optical sub-assembly. In an exemplary embodiment, the photodetector 6 may be planar having a first surface oriented to receive light normal to the longitudinal axis defined by the fiber core.

A fiber 10, oriented along a longitudinal axis, enters into the housing 2 through a small hole. The hole is typically sealed around the optical fiber segment to ensure that the housing is hermetically sealed. Light from the fiber 10 passes through a large v-groove 12 and a small v-groove 14 in the optical sub-assembly 4. The light from the fiber is reflected off of a reflector 16 onto the photodetector 6.

Figure 2:
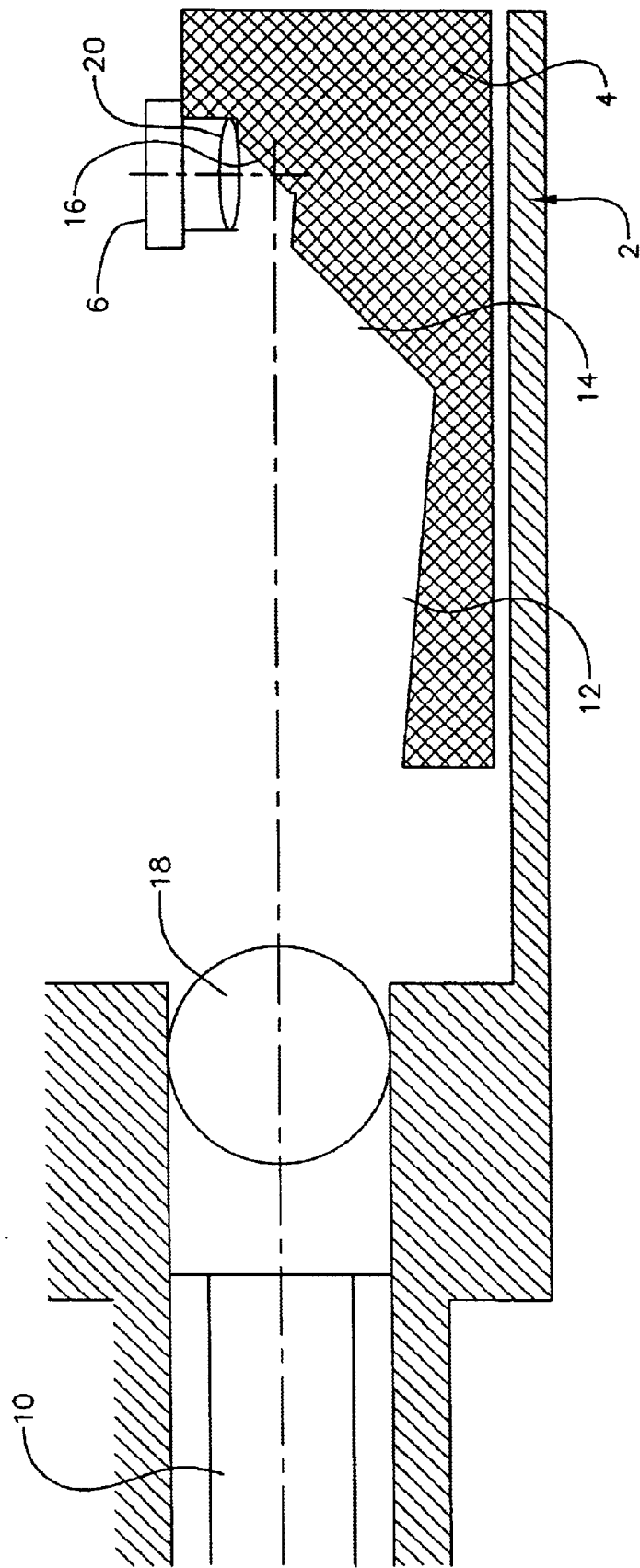
FIG. 2 is a cross section of a fiber to photodetector interface including a focusing system having multiple lenses for imaging the end face of the fiber onto the photodetector.

To provide sufficient coupling efficiency, a conventional package may utilize one or more lenses to interface an optical fiber to a photodetector. For example, as shown in FIG. 1 an optical receiver may utilize a ball lens 18 to focus light exiting from the end face of the fiber 10 onto a reflector 16. The ball lens may be epoxy bonded to the receiver housing to provide a hermetic seal for the receiver package. The reflector 16 reflects the received light onto the photodetector 6. Alternatively, as shown in FIG. 2, the reflector 16 may reflect light onto a second lens 20 that focuses a convergent beam onto the vertically mounted photodetector 6.

The housing 2 of an exemplary optical receiver may further include a bottom plate with four side walls and a top close out plate. In the described exemplary embodiment, the optical sub-assembly may be mounted onto the bottom plate of the housing with a conductive or a non-conductive epoxy and connection wires may be coupled to the input power leads as required.

An exemplary housing may further include a sleeve for receiving the distal end of a fiber. In one embodiment, a portion of the fiber may be metallized and soldered to a connector that is coupled to the housing within the sleeve to allow the photodetector to be hermetically sealed. In addition, a coaxial cable or differential voltage leads may provide an output from the optical receiver. The described exemplary fiber to photodetector interface may be utilized in a plastic encapsulated optical receiver as well as a hermetically sealed receiver.

Figure 3:
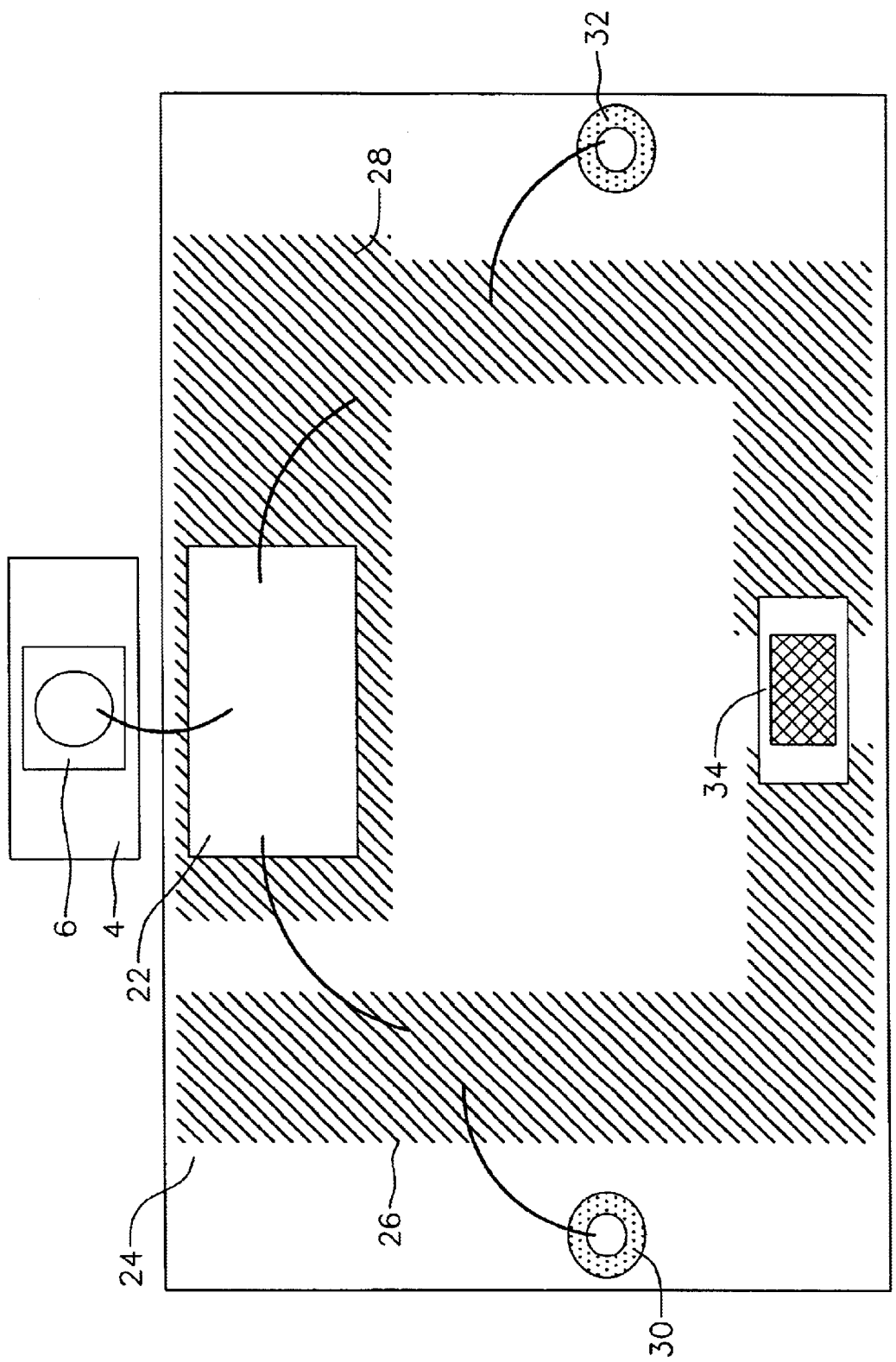
FIG. 3 is a cross section of a circuit coupled to the photodetector of FIG. 1 in accordance with an exemplary embodiment of the present invention.

According to an exemplary embodiment of the present invention, shown in FIG. 3, the photodetector 6 (See FIG. 2) is coupled to a transimpedance amplifier (TIA) 22 mounted on a circuit board 24. A source (power supply) pattern 26 and a ground pattern 28 may also be formed on the circuit board 24. The source (power supply) pattern 26 may be coupled to a source microstrip 30. The ground pattern 28 may be coupled to a ground microstrip 32.

In the described exemplary embodiment, an annular ohmic contact, formed on an upper surface of the photodetector 6, is coupled to an input terminal of the TIA 22 via conventional wire bonding techniques. Wire bonds may be formed from aluminum or gold, with small alloying additions to achieve the desired handling strength.

The wire bonds between the photodetector and the transimpedance amplifier may introduce a parasitic inductance that tends to reflect the signal generated by the photodetector back to the photodetector. The inductance generally increases with increasing wire length. Therefore, in one embodiment an interconnect metal (not shown) may be formed and patterned on an upper surface of the photodetector. The low resistance metalization layer may extend away from the annular ohmic contact to form a coplanar contact pad (not shown). The contact pad is preferably located so as to reduce the length of the wirebond coupling between the photodetector and transimpedance amplifier.

In operation, when the light beam is incident on the light receiving area of the photodetector, electron-hole pairs are generated. A bias voltage is applied across the ohmic contacts so that electrons and holes are moved by a bias electric field to bring about a flow of electric current having an intensity proportional to the intensity of the incident light. The output current signal of the photodetector may be coupled to an input of the transimpedance amplifier. The transimpedance amplifier converts the current signal to an output voltage signal.

An exemplary optical receiver module may further include a capacitor 34 coupled between the source pattern 26 and the ground pattern 28. The capacitor 36 shunts transients past internal receiver components that may be damaged by high voltages. In addition, the external capacitor substantially reduces the effects of transient noise on the output signal.

Figure 4:
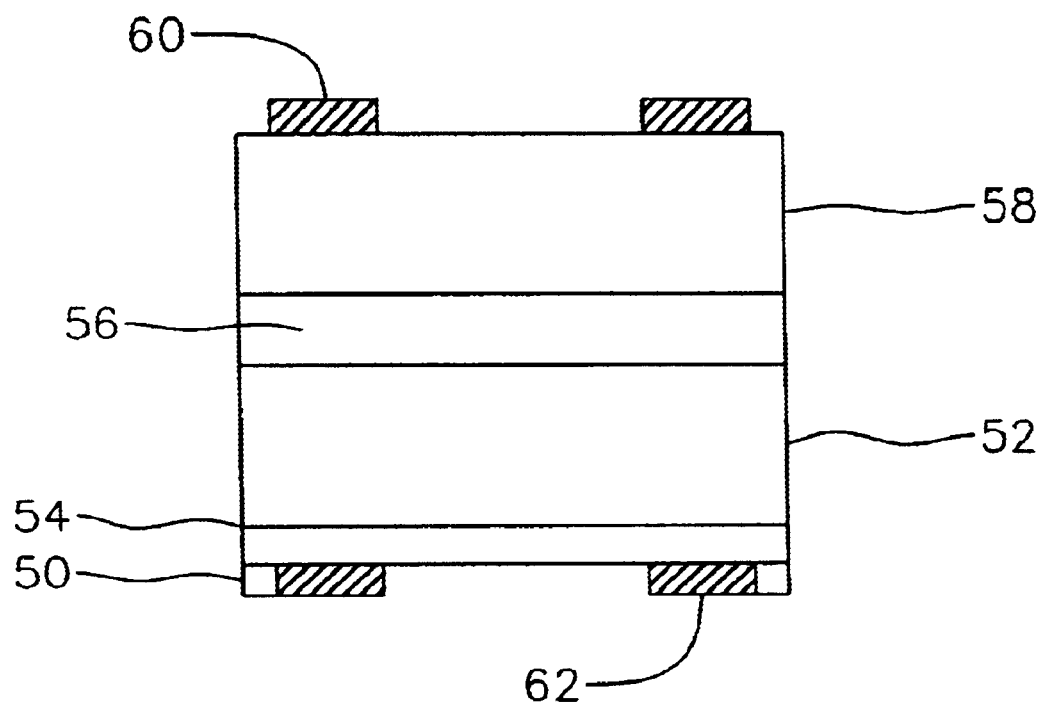
FIG. 4 is a cross section of a photodetector in accordance with an exemplary embodiment of the present invention.

Referring to the cross section of FIG. 4, the photodetector 6 may be coupled to the optical sub assembly 4 by a connection layer 50. The connection layer 50 may be formed from thermoplastic adhesive or solder. In the described exemplary embodiment, a lower side ohmic contact is coupled to a titanium, platinum, gold, etc. contact pad 8 on the optical sub assembly 4. The photodetector in the described exemplary embodiment may comprise a backside illuminated flip chip mounted p-i-n photodiode. Therefore, the lower n-type ohmic and contact pad may be coupled to the ground pattern on the circuit board. For this embodiment, it is assumed that the cathode of the photodetector is grounded. Therefore, the photodetector is energized by applying a positive signal to the photodetector. However, it is to be understood that photodetectors can also be packaged with the anode grounded, in which case a negative signal is applied to the module to energize the photodetector.

In the described exemplary embodiment, an n-type layer 52 is epitaxially grown on an n-type semiconductor substrate 54 The n-type layer 52 is preferably lattice-matched to the substrate 54 and any intervening layers. In an exemplary embodiment, the n-type layer 52 may be formed of InP. The n-type layer 52 may be doped with a suitable dopant, such as, for example, sulfur.

An active absorber region 56 that is absorptive at the wavelength of interest may be epitaxially formed on the n-type layer 52. The active absorber 56 may be formed from InGaAs or other suitable materials known in the art. In an exemplary embodiment a p-type layer 58 is formed on the active absorber layer 56 from InP. The p-type layer may be doped with a suitable dopant such as zinc.

To electrically contact the photodetector p-type and n-type ohmic contacts 60 and 62 are preferably deposited above the p-type region 58 and below the substrate 54 respectively. The p-type ohmic contact (also referred to as the annular ohmic contact) may be formed, for example, by depositing a p-type metalization, such as gold with 2% beryllium added or a layered structure of titanium/platinum/gold above the p-type layer, defining an annular opening therein by a lithographic masking and lift-off process. The p-type ohmic contact 60 may be deposited by electron beam evaporation. In one embodiment, the n-type ohmic contact 62 may be formed, for example, by depositing an n-type metalization such as AuGe/Ni/Au on a lower surface of the substrate.

One of skill in the art will appreciate that the present invention is not limited to a particular photodetector. Rather the present invention may be utilized with a variety of photodetectors known in the art, such as, for example, a metal-semiconductor-metal (MSM) photodetector or an avalanche photodiode. Further, the photodetector may be formed from a plurality of group III-V compound semiconductors, such as, for example, GaAs/AlGaAs, InGaAs/AlGaAs or InP/InGaAsP or other direct bandgap semiconductor materials. Therefore, the disclosed exemplary p-i-n photodiode embodiment is simply by way of example and not by way of limitation.

Figure 5:
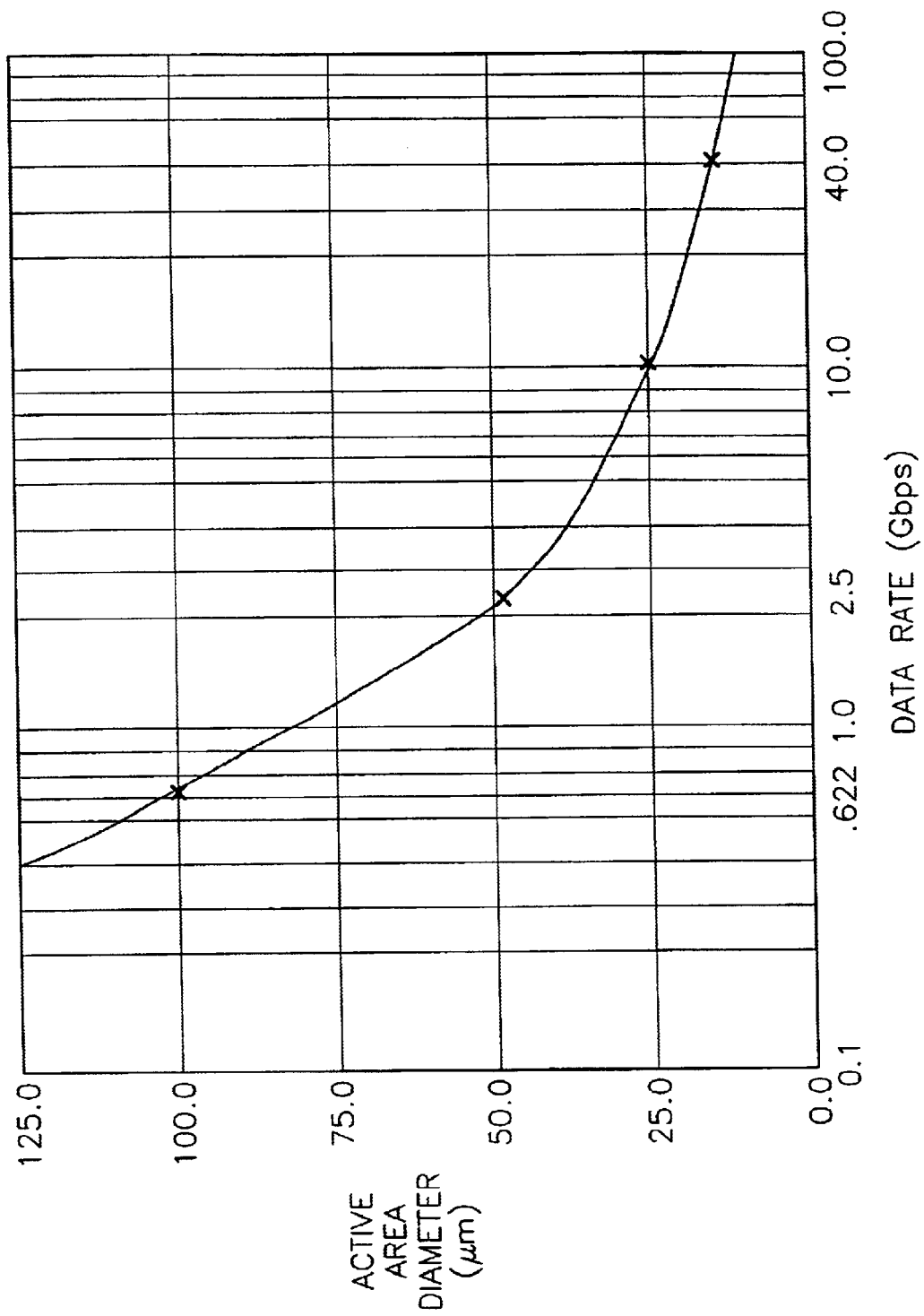
FIG. 5 graphically illustrates the typical operation data rate of a photodetector as a function of diameter of photodetector active area.

For efficient optical coupling, the diameter of the light receiving portion or active area of the photodetector is preferably equal to or greater than the diameter of the incident beam. However, the incident beam is a divergent beam having a diameter that increases as a function of distance from the reflector 16 (See FIG. 2). Therefore, for efficient optical coupling, the diameter of the light receiving portion or active area of the photodetector also increases with increasing separation between the photodetector and the reflector. FIG. 5 graphically illustrates an approximate relation between data rate and the diameter of the active area of a photodetector as limited by the capacitance of the photodetector.

However, for conventional silicon substrate systems the reflector 16 typically has a 54.7 degree slant angle. This is because the reflector is typically formed by etching from the [100] crystallographic plane along the [111] crystallographic silicon plane which results in the 54.7 degree slant angle. The reflected beam therefore has a divergence angle of approximately 19.4° with respect to the photodetector. The large divergence angle produces a focused beam around the edge of the detector and requires a relatively large speed limited device for efficient optical coupling.

Figure 6:
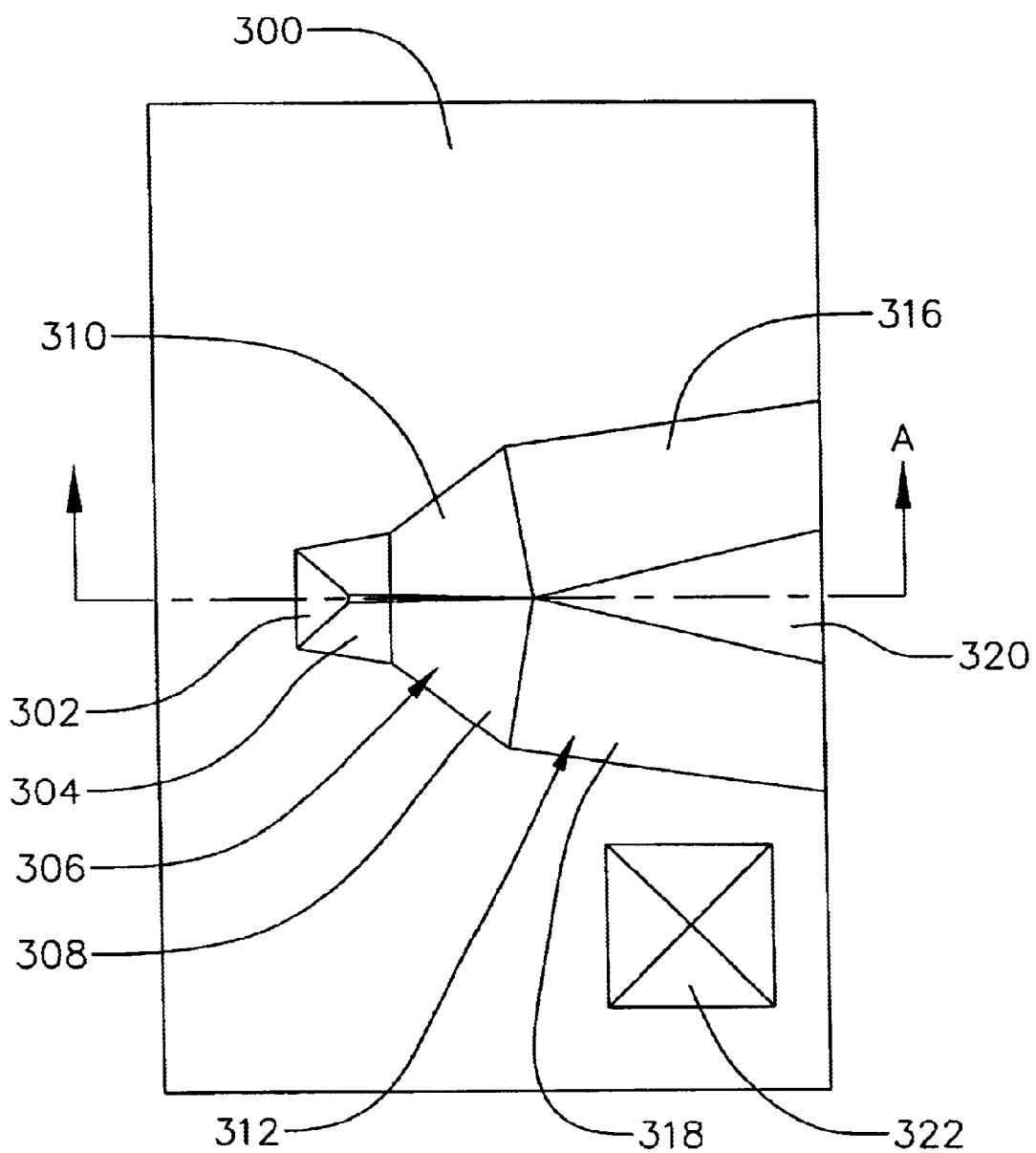
FIG. 6 is a top view of an optical sub-assembly according to an exemplary embodiment of the present invention.
Figure 7:
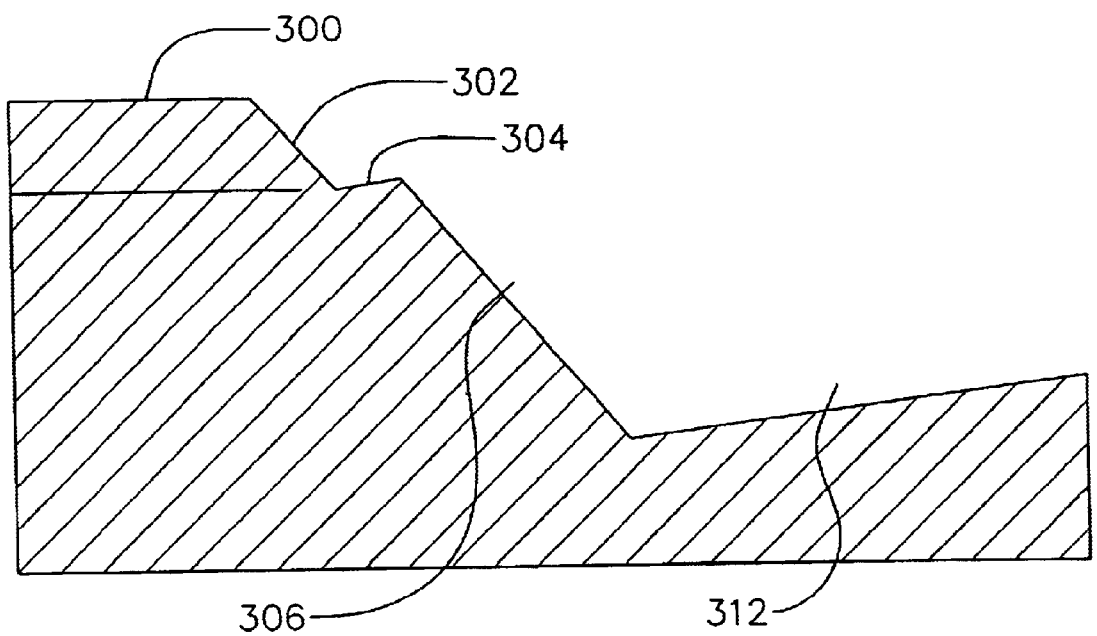
FIG. 7 is a cross sectional view of an optical sub-assembly taken along line A—A of FIG. 6.
Figure 8:
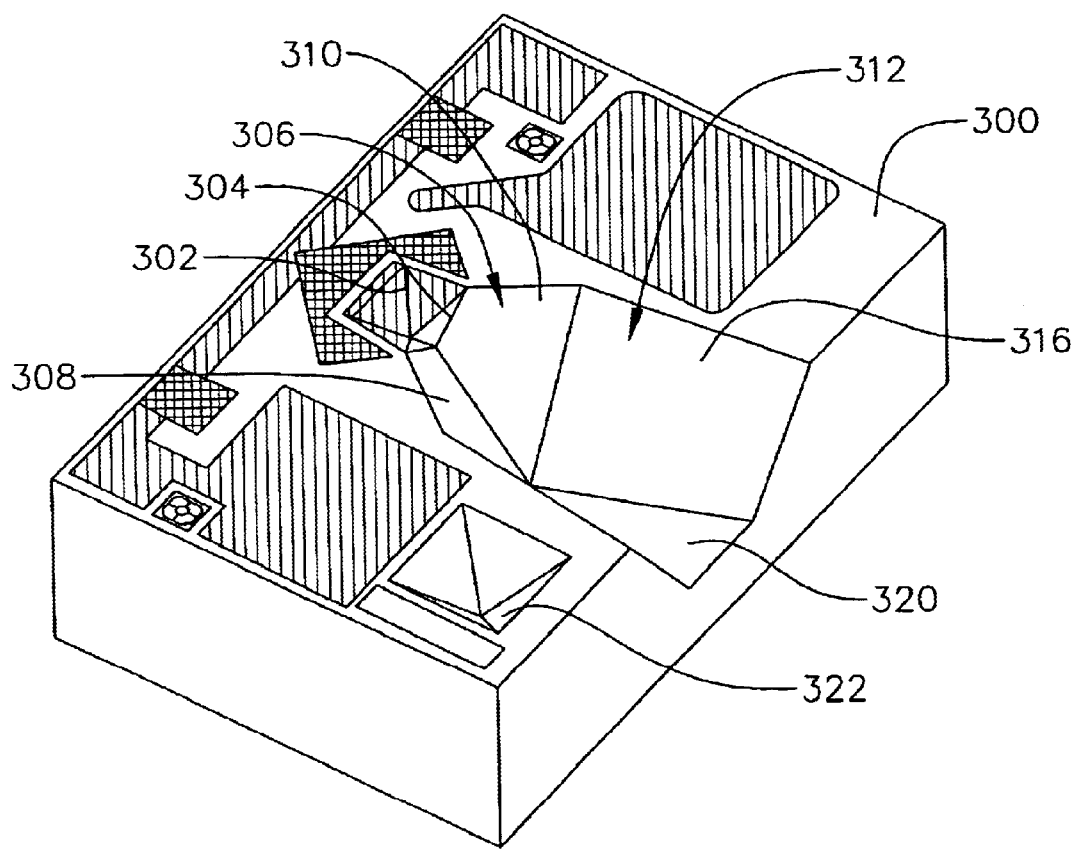
FIG. 8 is a perspective view of an optical sub-assembly in accordance with an exemplary embodiment of the present invention.

In an exemplary embodiment, as shown in FIGS. 6 to 8, the optical sub-assembly 4 has an off-axis top surface 300 for photodetector mounting. In an exemplary embodiment the top surface 300 may be cleaved in accordance with any of a variety of known techniques along a [100] silicon crystallographic plane by about 5.7° to about 9.7°. In the described exemplary embodiment the reflector 302 may then be formed by etching down from the cleaved top surface along a [111] silicon crystallographic plane. In an embodiment, the reflector 302 is etched down to a depth of about 0.168 mm.

In the described exemplary embodiment the reflector 302 has an angle of about 47°±2° relative to the top surface 300. A reflector angle α of about 47° relative to the top surface results in an incident beam having a divergence angle β of about 4° on a photodetector mounted to the top surface. This is substantially smaller than the approximately 19.4° divergence angle of the incident beam provided by a conventional reflector with a slant angle of approximately 54.7° relative to the top surface. Therefore, depending upon the spacing between the reflector and the photodetector, the described exemplary embodiment provides an reflected with a much smaller diameter than that provided by current systems. Therefore, the described exemplary embodiment may provide efficient coupling to a photodetector having a smaller diamater active area capable of operating at greater speeds.

Additionally, the described exemplary optical sub-assembly, has a lip 304 at the bottom of the reflector. The lip 304 is created by etching along the [100] crystallographic plane from the bottom of the reflector.

The described exemplary optical sub-assembly also includes a recess in the form of a small v-groove 306. The small v-groove is formed of two walls 308, 310 etched down along the [111] silicon crystallographic plane from an end of the lip 304. The two walls of the small v-groove are angled inward toward the longitudinal axis of the incoming fiber.

The size of the small v-groove 308 is limited by the width of the photodetector chip. By diagonally mounting a square photodetector chip to the optical sub-assembly, the size of the small v-groove may be increased. In an embodiment, the small v-groove has a length of about 0.275 mm.

Additionally, the described exemplary optical sub-assembly may include a recess in the form of a large v-groove 312 through which a beam from the optical fiber may pass. The large v-groove is formed by two walls 316, 318 etched along the [111] silicon crystallographic plane. The two walls of the large v-groove are also angled inward toward the longitudinal axis of the fiber. A bottom wall 320 is formed between the two walls of the large v-groove. The bottom wall is etched along the [100] plane. In an embodiment, the large v-groove 312 has an entrance opening about 1.186 mm wide with a depth of about 0.539 mm.

For efficient light coupling, the optical image of the fiber end should be closely centered with the photodetector active area. Therefore, the optical alignment between the components of the focusing system must be tightly controlled for efficient optical coupling between the fiber and the photodetector. However, the angle of the reflector according to the present invention creates a large amount of z-axis tolerance, which, coupled with the shapes of the large v-groove and small v-groove, may eliminate the need for active alignment along the z-axis.

Moreover, the low divergence (approximately 4°) angle optical beam incident upon the photodetector allows for increased alignment tolerance along the x and y axes. This is because the beam focus is tight with a relatively small diameter. Therefore a photodetector having an active area diameter that is larger than the diameter of the incident optical beam may be used without sacrificing necessary speed. The photodetector may operate at data rates up to about 10 Gbps. The described exemplary optical sub-assembly may also include an etched recess in the form a fiducial cavity 322 for holding the optical sub-assembly during manufacturing.

Although exemplary embodiments of the present invention have been described, they should not be construed to limit the scope of the present invention. Those skilled in the art will understand that various modifications may be made to the described embodiment. Further, the invention described herein will itself suggest to those skilled in the various arts, alternate embodiments and solutions to other tasks and adaptations for other applications. It is the applicants intention to cover by claims all such uses of the invention and those changes and modifications that could be made to the embodiments of the invention herein chosen for the purpose of disclosure without departing from the spirit and scope of the invention.

What is claimed is:

1. An optical receiver, comprising:
   a silicon substrate, said silicon substrate having a top surface cleaved from a [100] silicon crystallographic plane and a reflector extending from said top surface; and
   a photodetector coupled to said top surface of the silicon substrate, said photodetector being adapted to receive an incoming signal from a fiber, wherein said top surface is cleaved about 5.7° to 9.7° from the [100] silicon crystallographic plane.

2. The optical receiver of claim 1 wherein said reflector is created by etching into said silicon substrate from said cleaved top surface along a [111] silicon crystallographic plane.

3. The optical receiver of claim 1 wherein said reflector has an angle of about 45° to about 49° to said top surface.

4. The optical receiver of claim 3 wherein said silicon substrate further comprises a large v-groove having two side walls.

5. The optical receiver of claim 4 wherein said two side walls of said large v-groove are etched along [111] silicon crystallographic planes from said top surface.

6. The optical receiver of claim 4 wherein said optical sub-assembly further comprises a small v-groove having two walls, said small v-groove being coupled to said large v-groove.

7. The optical receiver of claim 6 wherein said two walls of said small v-groove are etched along [111] silicon crystallographic planes from said cleaved top surface.

8. An optical receiver, comprising:
   a silicon substrate, said silicon substrate having a top surface cleaved from a [100] silicon crystallographic plane and a reflector extending from said top surface; and
   a photodetector coupled to said top surface of the silicon substrate, said photodetector being adapted to receive an incoming signal from a fiber, wherein said reflector has an angle of about 45° to about 49° to said top surface.

9. The optical receiver of claim 8 wherein said silicon substrate further comprises a large v-groove having two side walls.

10. The optical receiver of claim 9 wherein said two side walls of said large v-groove are etched along [111] silicon crystallographic planes from said top surface.

11. The optical receiver of claim 9 wherein said optical sub-assembly further comprises a small v-groove having two walls, said small v-groove being coupled to said large v-groove.

12. The optical receiver of claim 11 wherein said two walls of said small v-groove are etched along [111] silicon crystallographic planes from said cleaved top surface.

13. An optical receiver, comprising:
   a housing adapted to receive a distal end of a fiber;
   an optical sub-assembly coupled to the housing, the optical sub-assembly having a silicon top surface and a reflector extending from said top surface; and
   a photodetector coupled to said top surface of said optical sub-assembly;
   wherein a light beam emanating from said fiber is reflected off of said reflector onto said photodetector; and
   wherein said top surface is cleaved about 5.7° to about 9.7° from the [100] silicon crystallographic plane; and
   said reflector is etched from said cleaved top surface along a [111] silicon crystallographic plane.

14. The optical receiver of claim 13 wherein said photodetector is an avalanche photodiode.

15. The optical receiver of claim 13 wherein said photodetector is a p-i-n photodiode.

16. The optical receiver of claim 13 wherein said photodetector may operate at data rates up to about 10 Gbps.

17. A silicon optical sub-assembly comprising:
   a top surface cleaved about 5.7° to about 9.7° from a [100] silicon crystallographic plane; and
   a reflector etched along a [111] silicon crystallographic plane from said top surface.

18. The silicon optical sub-assembly of claim 17 further comprising:
   a large v-groove etched from said top surface along [111] silicon crystallographic planes; and
   a small v-groove etched from said top surface along [111] silicon crystallographic planes, said small v-groove intersecting said large v-groove.

* * * * *